United States Patent [19]

Masuda et al.

[11] Patent Number: 5,325,067
[45] Date of Patent: Jun. 28, 1994

[54] APPARATUS FOR MATCHING IMPEDANCE IN AN ELECTROSTATIC SENSOR

[75] Inventors: Noboru Masuda; Tetsuo Oosawa; Yasutaka Fujii, all of Nagaokakyo, Japan

[73] Assignee: Murata Mfg. Co., Ltd., Nagaokakyo, Japan

[21] Appl. No.: 67,393

[22] Filed: May 25, 1993

Related U.S. Application Data

[63] Continuation of Ser. No. 868,458, Apr. 14, 1992, abandoned.

[30] Foreign Application Priority Data

Apr. 15, 1991 [JP] Japan .................. 3-109824

[51] Int. Cl.$^5$ .............................. G01R 27/26
[52] U.S. Cl. ................... 324/675; 324/681; 324/452; 333/32
[58] Field of Search ............ 324/452, 457, 663, 674, 324/675, 681, 682; 333/32

[56] References Cited

U.S. PATENT DOCUMENTS

| | | | |
|---|---|---|---|
| 3,464,015 | 8/1969 | Brabham ........................ | 333/32 |
| 3,541,435 | 11/1970 | Foster et al. ................... | 324/682 X |
| 4,048,598 | 9/1977 | Knight .......................... | 333/32 X |
| 4,673,869 | 6/1987 | Michael ......................... | 324/681 X |
| 5,128,622 | 7/1992 | Masuda et al. .................. | 324/682 |
| 5,150,062 | 9/1992 | Takeuchi ....................... | 324/675 |
| 5,198,777 | 3/1993 | Masuda et al. .................. | 324/671 |
| 5,231,359 | 7/1993 | Masuda et al. .................. | 324/675 |
| 5,245,290 | 9/1993 | Cannon et al. .................. | 324/457 |
| 5,258,728 | 11/1993 | Taniyoshi et al. ................ | 333/32 X |

FOREIGN PATENT DOCUMENTS

| | | |
|---|---|---|
| 0227501 | 8/1988 | European Pat. Off. . |
| 0398728 | 11/1990 | European Pat. Off. . |
| 0441587 | 8/1991 | European Pat. Off. . |
| 0442727 | 8/1991 | European Pat. Off. . |

OTHER PUBLICATIONS

High Yield Matching Structures for 20% Bandwidth Microwave Amplifiers, *IEEE MTT-S International Microwave Symposium Digest*, vol. 1, Jun. 1989, pp. 431-434.

Terminieren von Signalleitungen, Oct. 1990, *Elektronik*, vol. 39, Oct. 1990, pp. 236-254.

*Primary Examiner*—Kenneth A. Wieder
*Assistant Examiner*—Glenn Brown
*Attorney, Agent, or Firm*—Rogers, Howell & Haferkamp

[57] ABSTRACT

It is an object of the present invention to prevent variations in sensitivity of the sensor circuits of the respective channels by equalizing the power of oscillation frequency signals to be distributed/supplied from one oscillation circuit to the sensor circuits of the respective channels. Multi-channel sensor circuits are arranged with a common oscillation circuit. A high-impedance conversion circuit is connected to the output terminal of the oscillation circuit. A first impedance matching circuit for performing impedance matching of resonance circuits of the respective channels with reference to the oscillation circuit is arranged on the output side of the high-impedance conversion circuit. Second impedance matching circuits for performing impedance matching of the oscillation circuit with reference to the resonance circuits are connected at the input terminals of the resonance circuits of the respective channels. The first impedance matching circuit is connected to the second impedance matching circuits through coaxial cables.

18 Claims, 8 Drawing Sheets

APPARATUS FOR MATCHING IMPEDANCE IN AN ELECTROSTATIC SENSOR

This is a continuation of copending application Ser. No. 07/868,458 filed on Apr. 14, 1992, now abandoned.

BACKGROUND OF THE INVENTION

1. Field of the Invention

The present invention relates to an electrostatic sensor apparatus including a parallel arrangement of a plurality of sensor circuits, each designed to detect a change in exterior capacitance and output the resultant detection signal.

2. Description of the Prior Art

The present applicant has proposed a high-precision electrostatic sensor apparatus in, e.g., Japanese Patent Application No. 1-126234, which is capable of detecting a change in a very small electrostatic capacitance of $1 \times 10^{-5}$ pF.

As shown in FIG. 1, this apparatus includes an oscillation circuit 1, a high-impedance conversion circuit 1a connected to the output terminal of the oscillation circuit 1, a resonance circuit 2, a detection electrode 3 for detecting a change in electrostatic capacitance with respect the electrostatic capacitance of an object to be detected, a detection circuit 4, and an amplifier circuit 5. The oscillation circuit 1 and the resonance circuit 2 respectively include ceramic resonators as independent dielectric resonators. For example, as shown in FIG. 2, a resonant frequency $f_0$ of the resonance circuit 2 is set to be slightly shifted from a fixed oscillation frequency $f_1$ of the oscillation circuit 1, and the resonant frequency $f_0$ is shifted by $\Delta f$ in correspondence with a small capacitance change $\Delta C$ detected by electrode 3. The electrostatic capacitance change $\Delta C$ is then converted into an output voltage $\Delta V$. The voltage $\Delta V$ is detected/amplified and extracted.

Recently, there has been a demand for parallel processing of detection signals based on a plurality of electrostatic capacitances detected by an electrostatic sensor apparatus. In order to realize such parallel processing of signals, a plurality of channels, each including a sensor circuit consisting of the above-mentioned components from the oscillation circuit 1 to the amplifier circuit 5, may be adjacently arranged.

When, however, a plurality of channels, each including a sensor circuit consisting of the components from the oscillation circuit 1 to the amplifier circuit 5, are to be adjacently arranged, even a slight difference between the oscillation frequencies of the respective channels can cause interference, e.g., resonance between the oscillation frequencies of the respective channels. Consequently, accurate signal processing cannot be performed.

In order to solve such a problem, the present applicant has proposed a multi-channel electrostatic sensor apparatus in Japanese Patent Laid-Open No. 1-261756, in which a plurality of sensor circuits 6a, 6b, and 6c are operated with a common oscillation circuit 1, as shown in FIG. 3. According to this apparatus, there is no possibility of a shift in oscillation frequency signals supplied from the single oscillation circuit 1 to the sensor circuits 6a, 6b, and 6c of the respective channels through a high-impedance conversion circuit 1a, thus solving the problem of interference caused by the above-mentioned oscillation frequency shift.

However, in the system for distributing/supplying oscillation frequency signals to resonance circuits 2 of the respective channels by using the common oscillation circuit 1, impedance mismatching is caused on the resonance circuit 2 for the oscillation circuit 1 side. The oscillation frequency supplied to the resonance circuit 2 of each channel then distortion due to the influence of a reflected wave from each impedance mismatching portion. And loss of resonant curve or error in an output from each resonance circuit 2. For example, the resonance circuit 2 of the sensor circuit 6a has oscillation frequency characteristics indicated by the resonant curve shown in FIG. 4, whereas the resonance circuit 2 of the sensor circuit 6b has oscillation frequency characteristics indicated by the resonant curve shown in FIG. 5. That is, outputs or the waveforms of signals output to the resonance circuits 2 of the respective channels differ from each other, and the sensitivities of the sensor circuits of the respective channels of the electrostatic sensor apparatus vary.

SUMMARY OF THE INVENTION

The present invention has been made to solve the above-described problem, and has as its object to provide an electrostatic sensor apparatus which can prevent the sensitivities of sensor circuits of the respective channels from varying by distributing/supplying uniform oscillation frequency signals to the sensor circuits of the respective channels when oscillation frequency signals are distributed from a common oscillation circuit to the sensor circuits of the respective channels.

In order to achieve the above object, the present invention has the following arrangement. According to the present invention, there is provided an electrostatic sensor apparatus in which resonance circuits of a plurality of channels, each including a dielectric resonator which changes a resonant frequency in accordance with a change in exterior electrostatic capacitance, and a common oscillation circuit for oscillating a frequency signal is shared by the resonance circuits. The electrostatic sensor apparatus is characterized in that a high-impedance conversion circuit is connected to the output terminal of the oscillation circuit, and an impedance matching circuit (first impedance matching circuit) for performing impedance matching of the resonance circuits of the respective channels with reference to the oscillation circuit is connected to the output terminal of the high impedance conversion circuit. In addition to this arrangement, the apparatus is characterized in that second impedance matching circuits are respectively connected to the input terminals of the resonance circuits of the respective channels to perform impedance matching of the oscillation circuit with reference to the resonance circuits.

In the present invention having the above-described arrangement, oscillation frequency signals output from the oscillation circuit are supplied to the resonance circuits of the respective channels through the high-impedance conversion circuit and the impedance matching circuit. When the oscillation frequency signals are to be distributed/supplied to the resonance circuits of the respective channels, impedance matching of the resonance circuits of the respective channels is performed with reference to the oscillation circuit. With this operation, uniform oscillation frequency signals can be supplied from the oscillation circuit to the resonance circuits of the respective channels, and outputs free from loss of resonant curve and changes of output level can be obtained in the resonance circuits of the respective channels, thus preventing variation in sensitivity of the sensor circuits of the respective channels.

Furthermore, in the arrangement in which the second impedance matching circuits are connected to the input terminals of the resonance circuits of the respective circuits, impedance matching can be achieved with reference to both the oscillation circuit and the resonance circuits of the respective channels.

DETAILED DESCRIPTION OF THE PREFERRED EMBODIMENT

An embodiment of the present invention will be described below with reference to the accompanying drawings.

Figure 6:
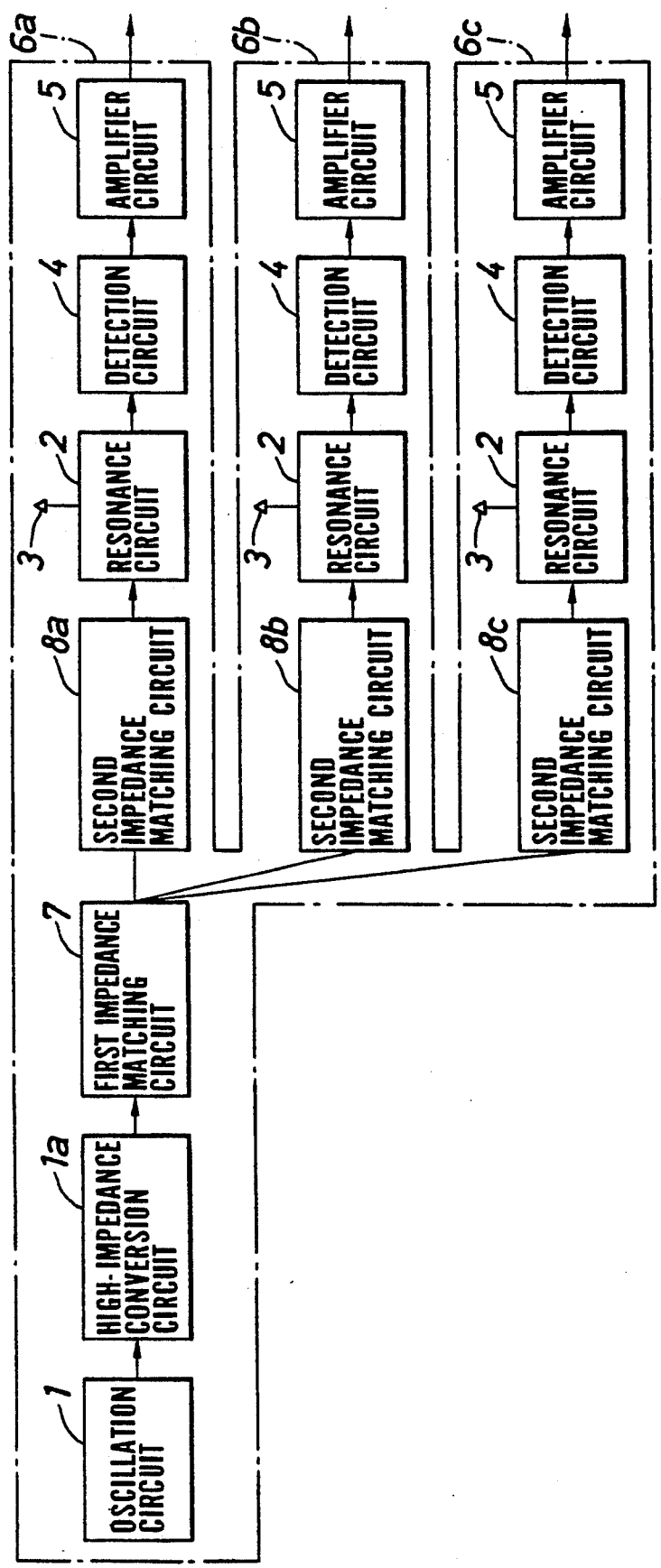
FIG. 6 is a block diagram showing an resonant frequency apparatus according to an embodiment of the present invention.

FIG. 6 is a block diagram showing the arrangement of an electrostatic sensor apparatus according to an embodiment of the present invention. Similar to the previously proposed apparatus, the electrostatic sensor apparatus of this embodiment includes an oscillation circuit 1, a high-impedance conversion circuit 1a, a resonance circuit 2, a detection electrode 3, a detection circuit 4, and an amplifier circuit 5. The embodiment is characterized in that a first impedance matching circuit 7 is arranged at the output terminal of the high-impedance conversion circuit 1, second impedance matching circuits 8a, 8b, and 8c are respectively arranged at the input terminals of sensor circuits 6a, 6b, and 6c of the respective channels, and the first impedance matching circuit 7 is connected to the second impedance matching circuits 8a, 8b, and 8c through microstrip lines or coaxial cables.

Figure 1:
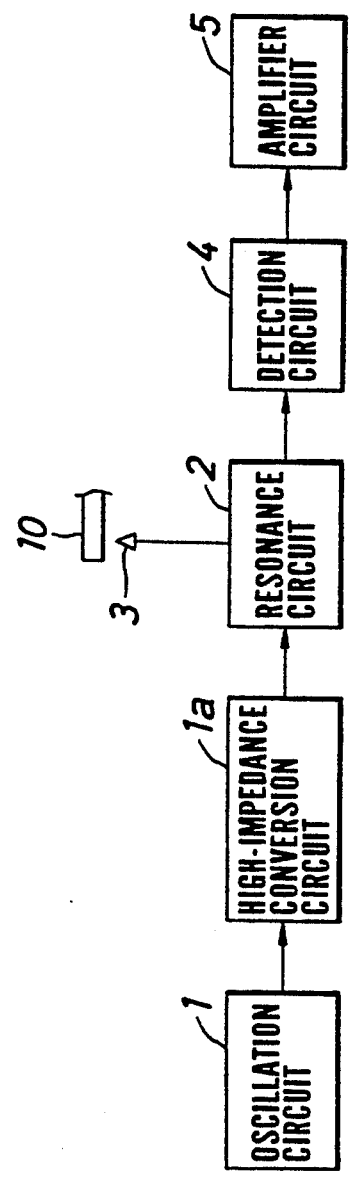
FIG. 1 is a block diagram showing an electrostatic sensor apparatus which has been previously proposed by the present inventors.
Figure 2:
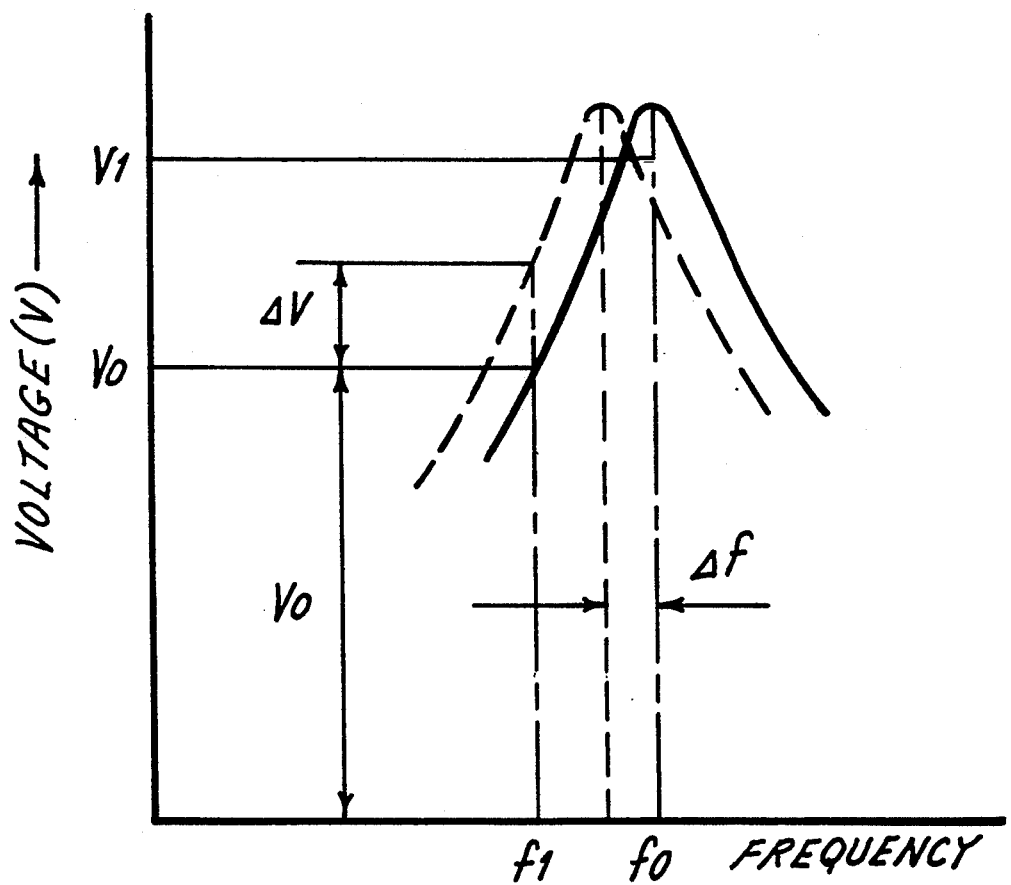
FIG. 2 is a graph for explaining an operation of detecting a small capacitance change in the proposed apparatus and an apparatus of an embodiment of the present invention which is designed to detect a change in exterior electrostatic capacitance by detecting a voltage change and a frequency shift from each resonance circuit.
Figure 3:
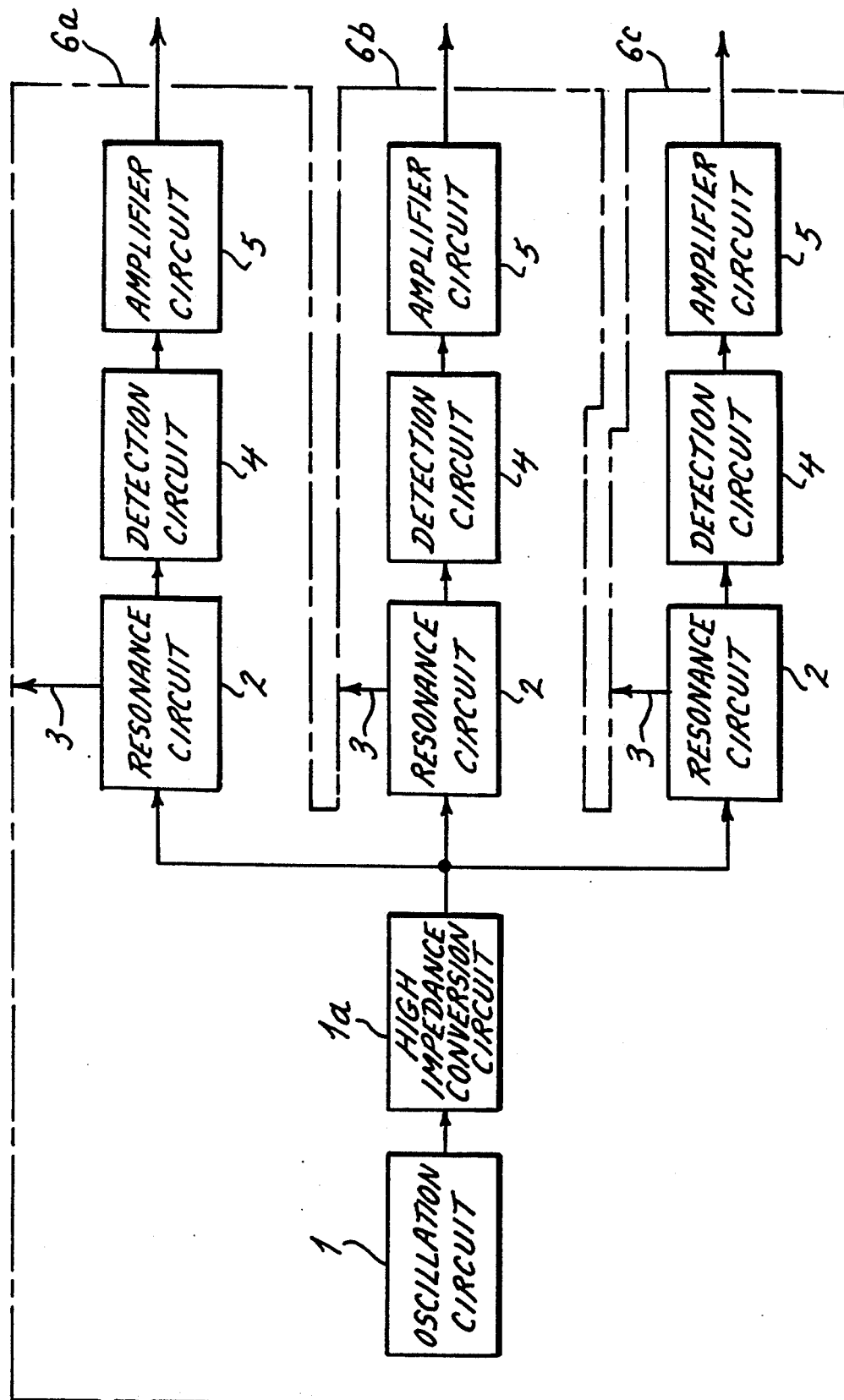
FIG. 3 is a block diagram showing a multi-channel electrostatic sensor apparatus previously proposed by the present inventors.

Other arrangements of the embodiment are the same as those of the circuit shown in FIG. 3.

Figure 7:
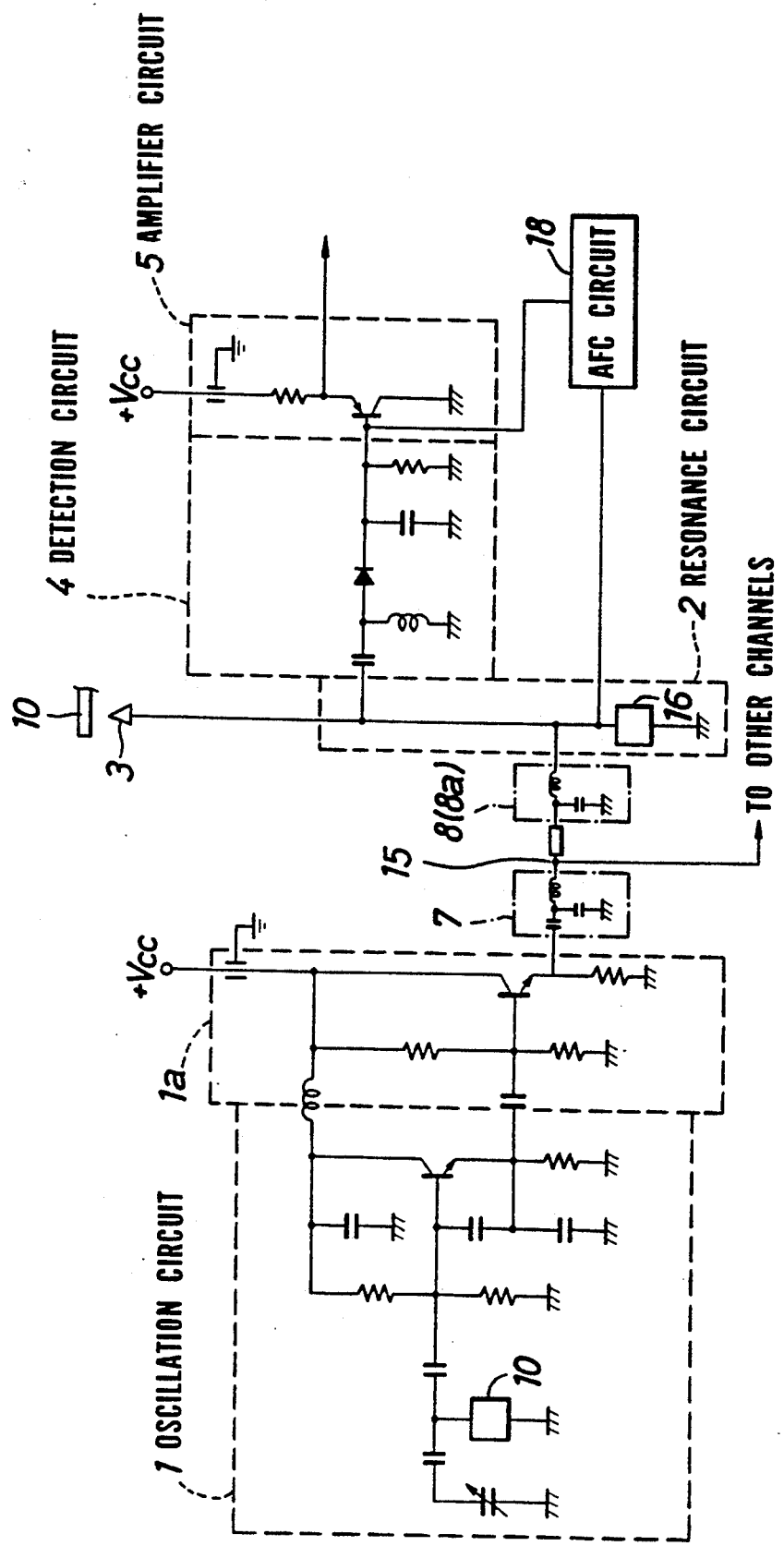
FIG. 7 is a circuit diagram showing a channel of the electrostatic sensor apparatus of the embodiment.
Figure 8A:
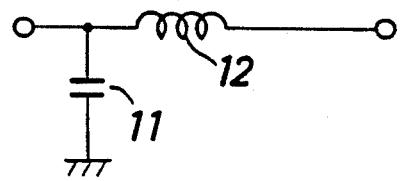
FIGS. 8(a) to 8(d) are circuit diagrams for explaining various types of impedance matching circuits, each constituting the embodiment.
Figure 8B:
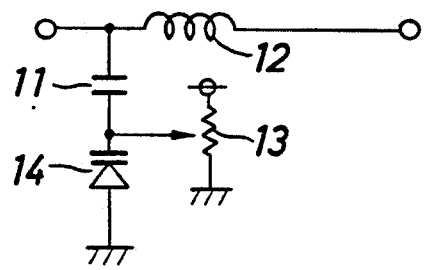
Figure 8C:
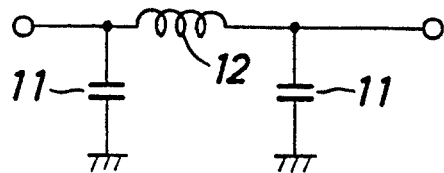
Figure 8D:
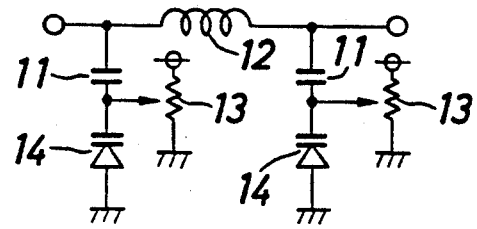

FIG. 7 shows the detailed arrangement of the sensor circuit of one channel in the electrostatic sensor apparatus of the embodiment. The oscillation circuit 1 includes a ceramic resonator 10 as a dielectric resonator, which is designed to output an oscillation frequency signal having a frequency as high as 0.5 GHz to 10 GHz in the embodiment. The high-impedance conversion circuit 1a is connected to the output terminal of the oscillation circuit 1, and the first impedance matching circuit 7 is connected to the output terminal of the high-impedance conversion circuit 1a.

The first impedance matching circuit 7 may employ various types of circuit arrangements. For example, various circuits shown in FIGS. 8(a) to 8(d) can be used. Referring to these circuits, reference numeral 11 denotes a capacitor; 12, an inductance; 13, a resistor; and 14, a variable-capacitance diode. One end of each coaxial cable 15, for example, which is connected to the resonance circuit 2 of a corresponding channel, is connected to the output terminal of the first impedance matching circuit 7. A second impedance matching circuit 8 constituted by one of the circuits shown in FIG. 8 is connected to the output end of each coaxial cable 15. The resonance circuit 2 is connected to the output terminal of the second impedance matching circuit 8.

Each resonance circuit 2 includes a ceramic resonator 16 as a dielectric resonator. The detection electrode 3 for detecting a change in electrostatic capacitance with respect to the electrostatic capacitance of an object 10 to be detected is connected to the terminal of the ceramic resonator 16. An AFC (Automatic Frequency Control) circuit 18 is arranged between the output terminal of the detection circuit 4 and the resonance circuit 2 as needed. The AFC circuit 18 is designed to stabilize a resonant frequency by correcting an error in resonance frequency of the resonance circuit 2 due to environmental changes.

The circuit conditions of the first impedance matching circuit 7 are set to perform impedance matching of the resonance circuit 2 of each channel with reference to the oscillation circuit 1. In addition, the circuit conditions of the impedance matching circuit 8 (8a, 8b, 8c) of each channel are set to perform impedance matching of the oscillation circuit 1 with reference to the resonance circuit 2.

Since impedance matching of the resonance circuits 2 of the respective channels is performed with reference to the oscillation circuit 1 in this manner, an oscillation frequency signal output from the oscillation circuit 1 will have no standing wave at resonant circuits portion, and uniform oscillation frequency signals are distributed from the single oscillation circuit 1 to the resonance circuits 2 of the respective channels. With this operation, an output from the resonance circuit 2 of each channel is made constant and includes no waveform distortion, and hence an output free from variation can be obtained in each channel. Therefore, the sensor circuit of each channel can perform high-sensitivity, high-precision sensing of a small capacitance change of $1 \times 10^{-5}$ pF.

Figure 4:
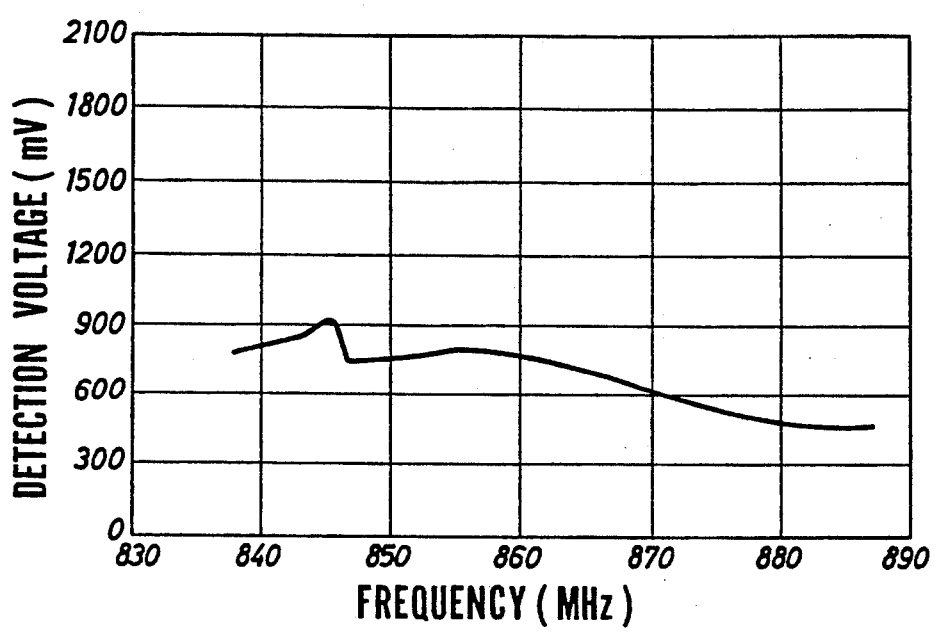
FIG. 4 is a curve showing the resonant frequency characteristics of the first channel of the proposed apparatus shown in FIG. 3.
Figure 5:
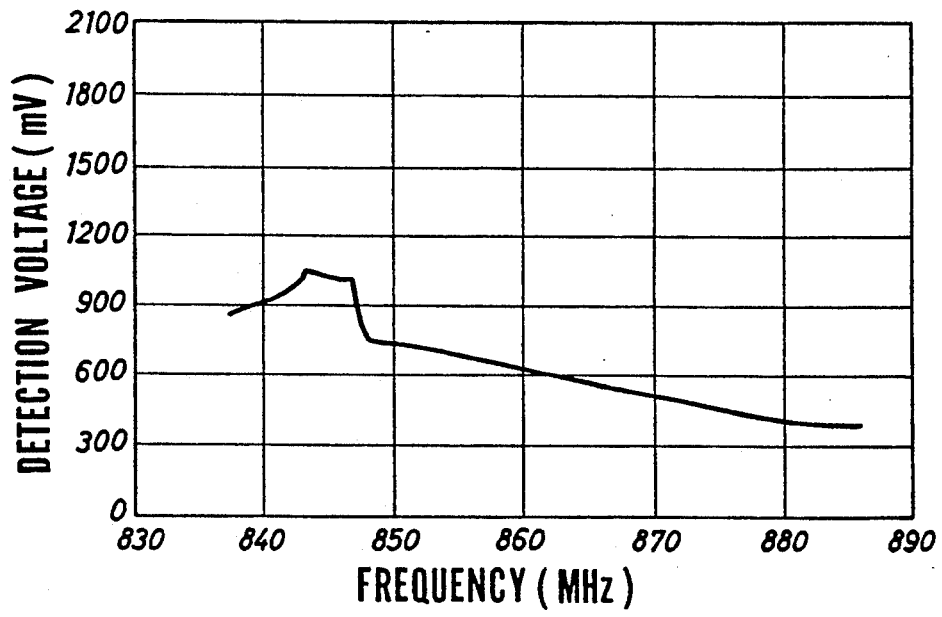
FIG. 5 is a curve showing the resonant frequency characteristics of the second channel of the proposed apparatus.
Figure 9:
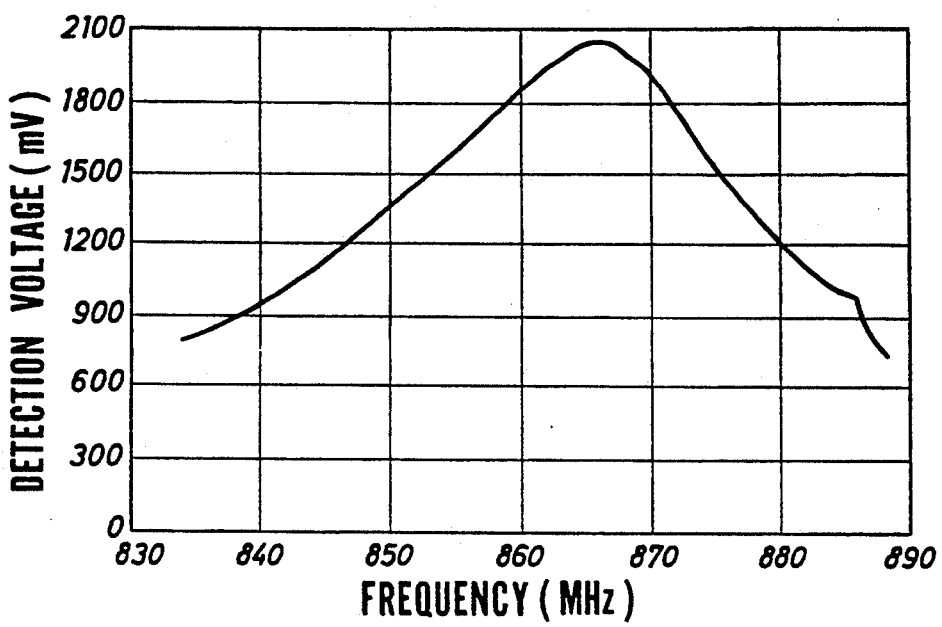
FIG. 9 is a curve showing the resonant frequency characteristics of the first channel of the electrostatic sensor apparatus of this embodiment.
Figure 10:
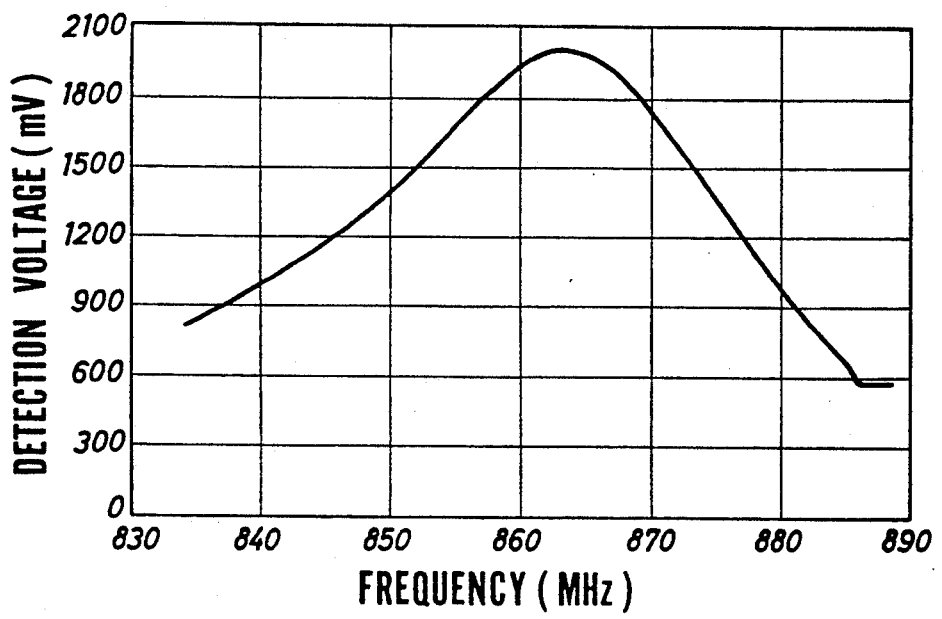
FIG. 10 is a curve showing the resonant frequency characteristics of a resonance circuit of the second channel of the electrostatic sensor apparatus of the embodiment.

FIGS. 9 and 10 respectively show the resonant frequency characteristic (FIG. 9) of the first resonance circuit 2 and the resonance frequency characteristic (FIG. 10) of the second resonance circuit 2 of the electrostatic sensor apparatus of this embodiment. As shown in FIGS. 9 and 10, outputs from the resonance circuits 2 and second are almost the same in terms of frequency characteristics, and each of the circuits can obtain a proper resonant curve. In comparison with the resonant curves shown in FIGS. 4 and 5 which have no impedance matching circuit the considerable effect of the embodiment obtained by arranging the impedance matching circuits 7 and 8a, 8b, and 8c can be confirmed.

The present invention is not limited to the embodiment described above but can be modified in various manners.

According to the present invention, one oscillation circuit is used in common to distribute oscillation frequency signals to the resonance circuits of a plurality of channels, and an impedance matching circuit is connected between a high-impedance circuit and the resonance circuits of the respective channels. With this arrangement, high accuracy oscillation frequency signals can be supplied from the oscillation circuit to the resonance circuits of each channels, thus preventing change of output level from occurring in resonance frequency signals from the resonance circuits of the each channels. With this operation, a high-performance electrostatic sensor apparatus can be provided.

Furthermore, in the arrangement in which second impedance matching circuits for performing impedance matching of the oscillation circuit with reference to the resonance circuits of each channel are connected to the input terminals of the resonance circuits of the respective channels, impedance matching can be achieved with reference to both the oscillation circuit and the resonance circuit of each channel, thereby providing an electrostatic sensor apparatus having higher performance.

What is claimed is:

1. An electrostatic sensor apparatus comprising:
one oscillating circuit;
a high-impedance circuit connected to an output terminal of said oscillating circuit;
a first impedance matching circuit connected to said high-impedance circuit; and
a plurality of parallel connected multi-channel sensor circuits connected in series to said first impedance matching circuit,
wherein each of said sensor circuits has a resonance circuit including a dielectric resonator which changes a resonant frequency in accordance with a change in exterior electrostatic capacitance, and
said first impedance matching circuit is set to perform impedance matching of said sensor circuit of each channel and said oscillating circuit.

2. An apparatus according to claim 1, wherein each of said sensor circuits includes a second impedance matching circuit connected between said resonance circuits and said first impedance matching circuit, and
each of said second impedance matching circuits is set to perform impedance matching of said oscillators and said resonance circuits.

3. An apparatus according to claim 2, wherein said dielectric resonator is a ceramic resonator.

4. An apparatus according to claim 1, further comprising detection circuits connected to said resonance circuits, wherein an AFC (Automatic Frequency Control) circuit for stabilizing a resonance frequency is connected between an output terminal of said detection circuits and said resonance circuits.

5. In an electrostatic sensor apparatus comprising a single oscillating circuit and a plurality of sensor circuits connected to said single oscillating circuit, said sensor circuits being connected in parallel with each other, the improvement comprising means connected between said single oscillating circuit and said plurality of sensor circuits for matching the impedance therebetween.

6. The apparatus of claim 5 wherein said impedance matching means comprises a first impedance matching circuit connected to the output of said oscillating circuit and a plurality of second impedance matching circuits, one of said second impedance matching circuits being connected to the input of each of said sensor circuits.

7. The apparatus of claim 6 further comprising a plurality of different circuit configurations, each of said circuit configurations having means for matching impedance and wherein each of said first and second impedance matching circuits comprises any one of said circuit configurations.

8. The apparatus of claim 7 wherein said first impedance matching circuit further includes a DC blocking capacitor.

9. The apparatus of claim 8 wherein said oscillating circuit includes an oscillator circuit and a high impedance circuit connected between said oscillator circuit and said first impedance matching circuit.

10. The apparatus of claim 9 wherein each of said sensor circuits includes a resonance circuit having a dielectric resonator which changes in frequency in response to a change in its sensed external electrostatic capacitance.

11. The apparatus of claim 10 wherein said dielectric resonators are each comprised of a ceramic resonator.

12. The apparatus of claim 11 wherein each of said sensor circuits further comprises a detection circuit connected to an output of its associated ceramic resonator and an output amplifier circuit connected to an output of said detection circuit, and wherein an AFC circuit for stabilizing each resonance circuits's resonance frequency is connected between an output of each of said detection circuits and an output of said detection circuit's associated ceramic resonator.

13. In an electrostatic sensor apparatus comprising a single oscillating circuit, said oscillating circuit having a high impedance output circuit connected to its output, and a plurality of sensor circuits, each of said sensor circuits having a dielectric resonator and an associated detection and output amplifier circuit, said sensor circuits being connected in parallel with each other, the improvement comprising a first impedance matching circuit connected to the output of said high impedance circuit to thereby normalize its output, and a plurality of second impedance matching circuits connected to the plurality of sensor circuits, each of said second impedance matching circuits having means for normalizing the apparent input to each of said sensor circuits to thereby eliminate impedance mismatch between said single oscillating circuit and said plurality of sensor circuits.

14. The apparatus of claim 13 further comprising a plurality of different circuit configurations, each of said circuit configurations having means for matching impedance and wherein each of said first and second impedance matching circuits comprises any one of said circuit configurations.

15. The apparatus of claim 14 wherein said first impedance matching circuit further includes a DC blocking capacitor.

16. The apparatus of claim 15 further comprising an AFC circuit connected between the input and output of each detection circuit to thereby stabilize the resonance frequency of each of said sensors.

17. The apparatus of claim 16 wherein each of said resonance circuits includes a dielectric resonator.

18. The apparatus of claim 17 wherein each of said dielectric resonators comprise a ceramic resonator.

* * * * *